(12) United States Patent
Maesaki et al.

(10) Patent No.: US 6,967,495 B2
(45) Date of Patent: Nov. 22, 2005

(54) DYNAMIC BURN-IN APPARATUS AND ADAPTER CARD FOR DYNAMIC BURN-IN APPARATUS

(75) Inventors: Yoshihiro Maesaki, Kawasaki (JP); Hiroshi Teshigawara, Kawasaki (JP); Sadao Ishihara, Yokohama (JP); Yukio Tabuchi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/945,839

(22) Filed: Sep. 21, 2004

(65) Prior Publication Data

US 2005/0099197 A1 May 12, 2005

Related U.S. Application Data

(63) Continuation of application No. PCT/JP03/01946, filed on Feb. 21, 2003.

(30) Foreign Application Priority Data

Apr. 5, 2002 (JP) .............................. 2002-103603

(51) Int. Cl.[7] .......................................... G01R 31/02
(52) U.S. Cl. .................... 324/760; 324/765; 324/158.1
(58) Field of Search .............................. 324/73.1, 755, 324/760, 765, 158.1; 714/724, 738; 702/118–119; 361/719–722, 736–737, 760–764, 778

(56) References Cited

U.S. PATENT DOCUMENTS

| 5,794,175 | A  | * | 8/1998 | Conner ........................ 702/119 |
| 6,472,895 | B2 | * | 10/2002 | Jaimsomporn et al. ..... 324/760 |
| 6,833,721 | B2 | * | 12/2004 | Park et al. ................... 324/765 |
| 2001/0048634 | A1 | | 12/2001 | Maeda ........................ 365/233 |

FOREIGN PATENT DOCUMENTS

| JP | 3-204951 | 9/1991 |
| JP | 5-258599 | 10/1993 |
| JP | 8-211126 | 8/1996 |
| JP | 10-221411 | 8/1998 |
| JP | 2001-201533 | 7/2001 |
| JP | 2001-344994 | 12/2001 |

* cited by examiner

Primary Examiner—Minh N. Tang
(74) Attorney, Agent, or Firm—Staas & Halsey LLP (57) ABSTRACT

In an adapter card, is a clock signal converting circuit converts a clock signal, output from a signal generator of a burn-in apparatus, from a lower—to a higher-frequency clock signal. Plural delay circuits synchronize each burn-in signal output from the signal generator with the clock signal. A connector of an adapter is connected between a burn-in card and a connector mounted in a burn-in chamber, to burn in a semiconductor device mounted on the burn-in card. The output of the signal generator is fed into the adapter card via its connector, and the output of the adapter card is supplied to the semiconductor device mounted on the burn-in card to burn in the semiconductor device.

7 Claims, 9 Drawing Sheets

DYNAMIC BURN-IN APPARATUS AND ADAPTER CARD FOR DYNAMIC BURN-IN APPARATUS

CROSS-REFERENCE TO RELATED APPLICATION

This application is a continuation application and is based upon PCT/JP03/01946, filed on Feb. 21, 2003, which claims priority from Japanese Patent Application No. 2002-103603, filed on Apr. 5, 2002.

TECHNICAL FIELD OF THE INVENTION

The present invention relates to a burn-in apparatus for screening out defective semiconductor devices and an adapter card for use with the burn-in apparatus, and more particularly to a burn-in apparatus and an adapter card to be used with the burn-in apparatus to enable it to perform dynamic burn-in at high speed.

PRIOR ART

It is known in the art to perform a dynamic burn-in test, for example, prior to receiving semiconductor devices, by placing the semiconductor devices in a burn-in chamber and by applying a clock signal and a burn-in signal from a signal generator to the semiconductor devices, in order to screen out defective devices.

A burn-in apparatus comprises a back board on which a signal generator is mounted and a burn-in chamber, and the burn-in test is performed by mounting a semiconductor device to be tested, such as an LSI, on a card specifically designed for burn-in (a printed board for mounting a semiconductor device thereon and hereinafter referred to as the burn-in card) and by applying a clock signal and a burn-in signal from the signal generator to the semiconductor device for a predetermined length of time.

In recent years, the speed and functionality of general-purpose memories, etc. have been increasing, and there has developed a need for a burn-in apparatus that can handle such devices. However, the upper limit of the clock frequency of signal generators used in currently available burn-in apparatuses is about 10 MHz, and conventional burn-in methods cannot be expected to achieve the effect of burn-in when a clock frequency of a high-speed general-purpose memory is, for example, 100 MHz or higher.

Under the circumstances, therefore, it is practiced to extend the burn-in time in order to increase the effect of burn-in when testing such high-speed general-purpose memories. On the other hand, burn-in apparatuses are relatively expensive, and it is difficult to purchase a new high-speed burn-in apparatus.

SUMMARY OF THE INVENTION

The present invention has been devised in view of the above situation, and an object of the invention is to provide an adapter card for a burn-in apparatus that is relatively simple in circuit configuration and that can burn-in high-speed, high-functionality semiconductor devices in a short time.

Another object of the invention is to provide a burn-in apparatus that, by just using a single adapter card, can burn-in high-speed, high-functionality semiconductor devices mounted on a plurality of burn-in cards, in a short time.

According to an aspect of the present invention, an adapter card connecting a signal generator of a dynamic burn-in apparatus to a burn-in card with semiconductors is provided. The adapter card comprises an input connector receiving a burn-in signal in synchronization with a clock signal from the signal generator, a clock signal converting circuit which converts the clock signal from said input connector and an output connector providing the burn-in signal in synchronization with the converted clock signal to said semiconductor devices.

According to another aspect of the present invention, a dynamic burn-in apparatus for semiconductor devices mounted on a burn-in card is provided. The dynamic burn-in apparatus comprises a signal generator and an adapter card. The adapter card comprises an input connector receiving a burn-in signal in synchronization with a clock signal from said signal generator, a clock signal converting circuit which converts the clock signal input from said input connector and an output connector providing the burn-in signal in synchronization with said converted clock signal to the semiconductor devices.

Further, the dynamic burn-in apparatus can comprise a board carrying the signal generator. The board has a pair of connectors and at least one burn-in card connecting connector, wherein the signal generator connects to the semiconductor devices mounted on the burn-in card via the adapter card connected between the pair of connectors.

Furthermore, the dynamic burn-in apparatus can comprise oscillator circuit card having an oscillator circuit for providing a higher frequency clock signal in synchronization with the clock signal from the signal generator. The adapter card connects to the pair of adapter card connectors via the oscillator circuit card.

BRIEF DESCRIPTION OF THE DRAWINGS

The present invention will be described below with reference to the accompanying drawings, wherein.

DETAILED DESCRIPTION OF THE PREFERRED EMBODIMENTS OF THE INVENTION

For a better understanding of the advantageous effects of the present invention, a description will be given first of a prior art example to which the present invention is not applied.

Figure 8:
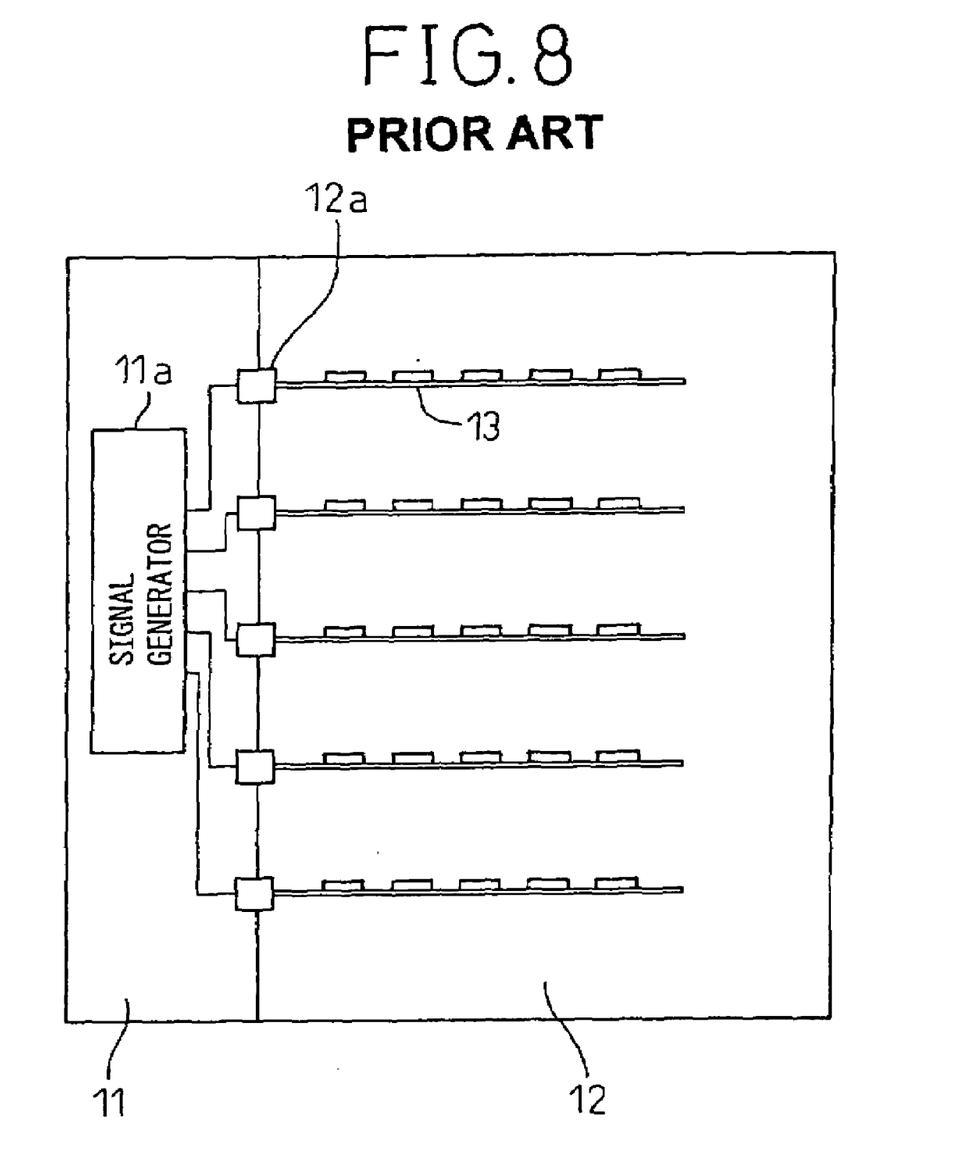
FIG. 8 is a diagram showing in simplified form the configuration of a burn-in apparatus according to the prior art.

FIG. 8 shows in simplified form the configuration of a burn-in apparatus according to the prior art. As shown in the figure, the burn-in apparatus comprises a back board 11, on which a signal generator 11a is mounted, and a burn-in chamber 12, and burn-in test is performed on by mounting semiconductor devices to be tested, such as LSIs, on burn-in cards 13 each connected to a connector 12a in the burn-in chamber 12, and by applying a clock signal and a burn-in signal from the signal generator 11a to the semiconductor devices for a predetermined length of time.

Figure 9:
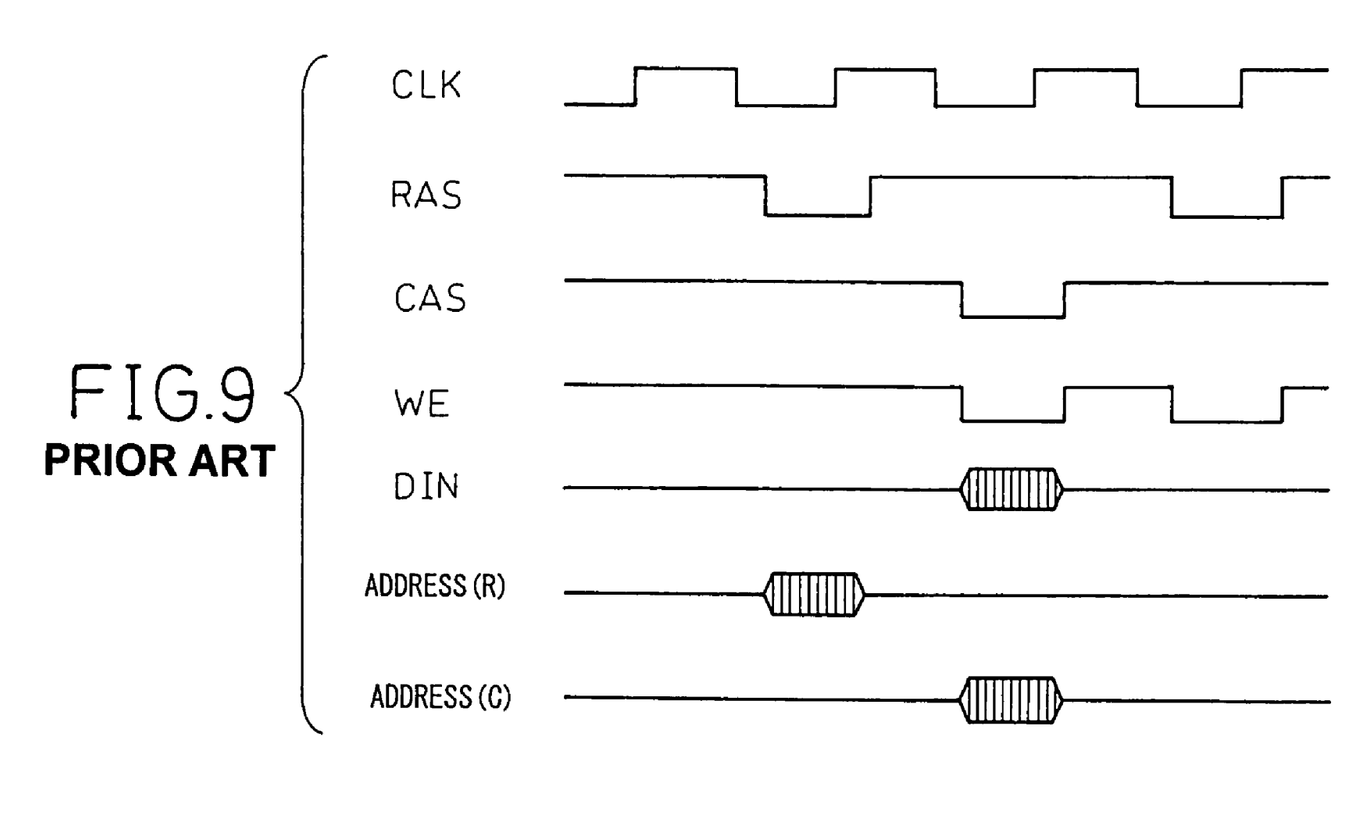
FIG. 9 is a diagram showing one example of a burn-in signal used in the prior art on general-purpose memories.

FIG. 9 shows examples of the clock signal and burn-in signal used to burn-in general-purpose memories such as DRAMs, SRAMs, etc. As shown in the figure, in order to burn-in such general-purpose memories, the clock signal CLK is supplied to the general-purpose memories along with signals consisting of a row address strobe RAS (hereinafter simply RAS), a column address strobe CAS (hereinafter simply CAS), a write enable WE, data DIN, a row address AD(R), and a column address AD(C) (here, RAS, CAS, WE, DIN, AD(R), and AD(C) are collectively called the burn-in signal).

In this prior art example, the effect of burn-in cannot be expected in the case of high-speed memories, as previously described.

An embodiment of the present invention will be described below.

Figure 1:
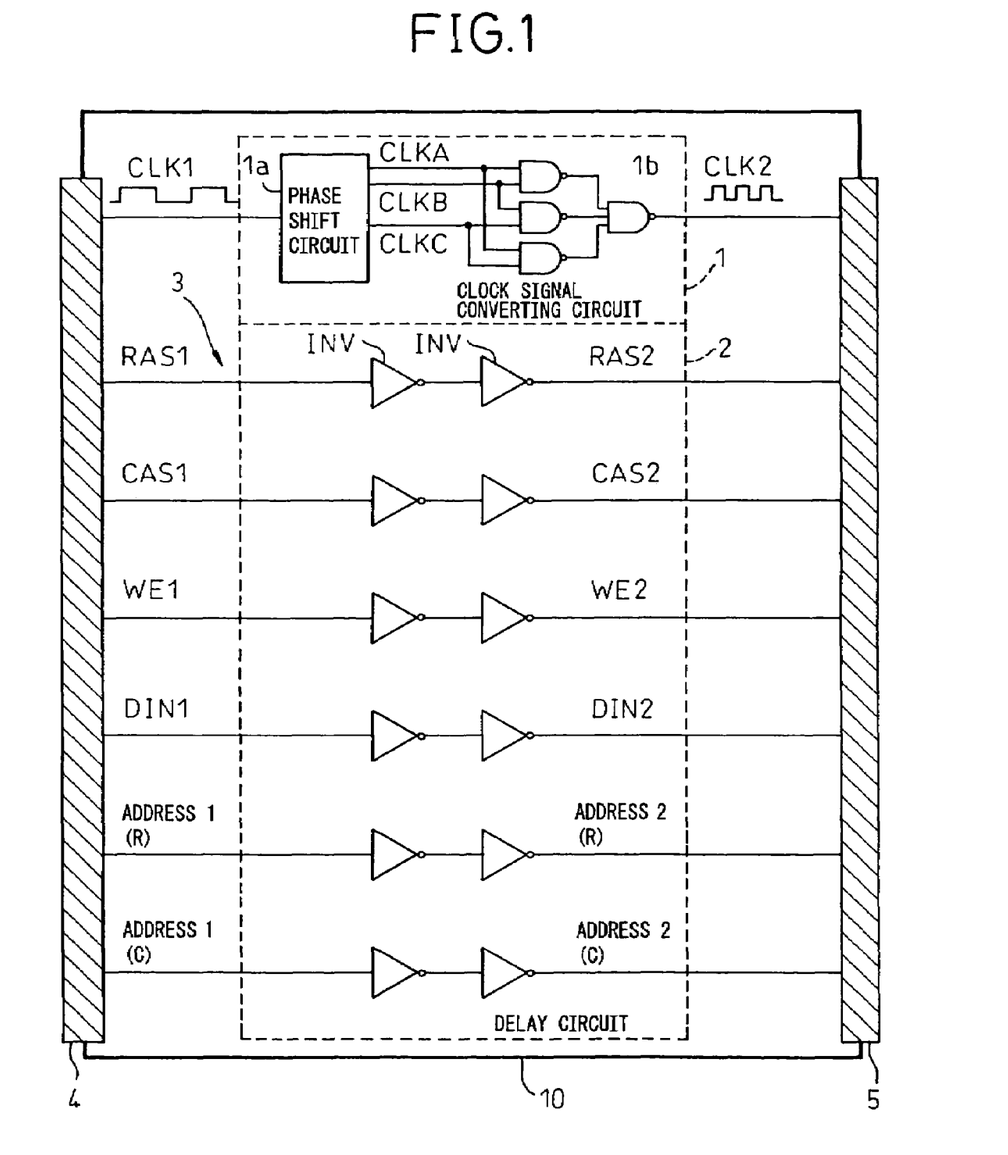
FIG. 1 is a diagram showing one configuration example of an adapter card according to an embodiment of the present invention.

FIG. 1 shows one configuration example of an adapter card according to the embodiment of the present invention. The following description deals with the adapter card to burn-in general-purpose memories, but it will be appreciated that the present invention can be equally applied to the burn-in of other kinds of semiconductor devices.

As shown in FIG. 1, a circuit block 3, a connector 4, and a connector 5 are mounted on the adapter card 10. The circuit block 3 contains a clock signal converting circuit 1 comprising a phase shift circuit 1a and a gate circuit 1b configured as a multiplier circuit, and a delay circuit 2 constructed by connecting a plurality of inverter circuits in series.

The burn-in signal of FIG. 9 output from the signal generator 11a is input via the connector 4 to the adapter card 10, and an output from the adapter card 10 is supplied to each burn-in card 13 via the connector 5.

The clock signal converting circuit 1 mounted on the adapter card 10 converts the input clock signal CLK1 into a clock signal CLK2 whose frequency is, for example, three times the frequency of the input signal.

Figure 2:
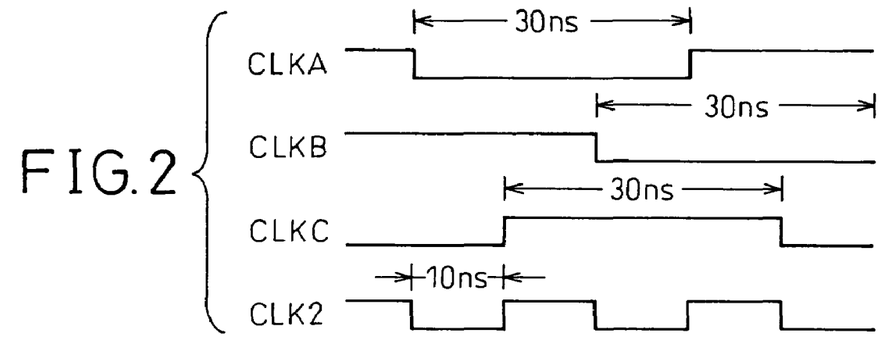
FIG. 2 is a diagram for explaining the operation of a clock signal converting circuit mounted on the adapter card.

FIG. 2 shows the operation of the clock signal converting circuit 1. As shown, the phase shift circuit 1a in the clock signal converting circuit 1 shifts the phase of the clock signal CLK1 output from the signal generator 11a and whose half cycle is 30 ns, and generates clock signals CLKA, CLKB, and CLKC shifted in phase by 10 ns relative to each other.

The clock signals CLKA, CLKB, and CLKC output from the phase shift circuit 1a are supplied to the gate circuit 1b constructed from NAND gates, and the gate circuit 1b generates from the clock signals CLKA, CLKB, and CLKC the clock signal CLK2 whose half cycle is 10 ns, as shown in FIG. 2.

The delay circuit 2 mounted on the adapter card 10 comprises a plurality of inverter circuits INV in series, and provides a predetermined amount of delay to the burn-in signal of RAS1, CAS1, WE1, AD1(R), and AD1(C) to achieve synchronization with the clock signal CLK2.

FIGS. 1 and 2 above are shown for the case where the clock signal output from the signal generator 11a is converted into a clock signal whose frequency is three times the frequency of the input signal, but the circuit may be configured so that the phase of the input clock signal is shifted by 1/n (n=1, 2, . . . ) by the phase shift circuit 1a to generate n clock signals shifted in phase by 1/n relative to each other, and so that the gate circuit 1b generates, from the n clock signals, a clock signal whose frequency is n times the frequency of the input clock signal.

The number of inverter circuits INV in the delay circuit 2 is suitably selected according to the amount of delay required.

Figure 3:
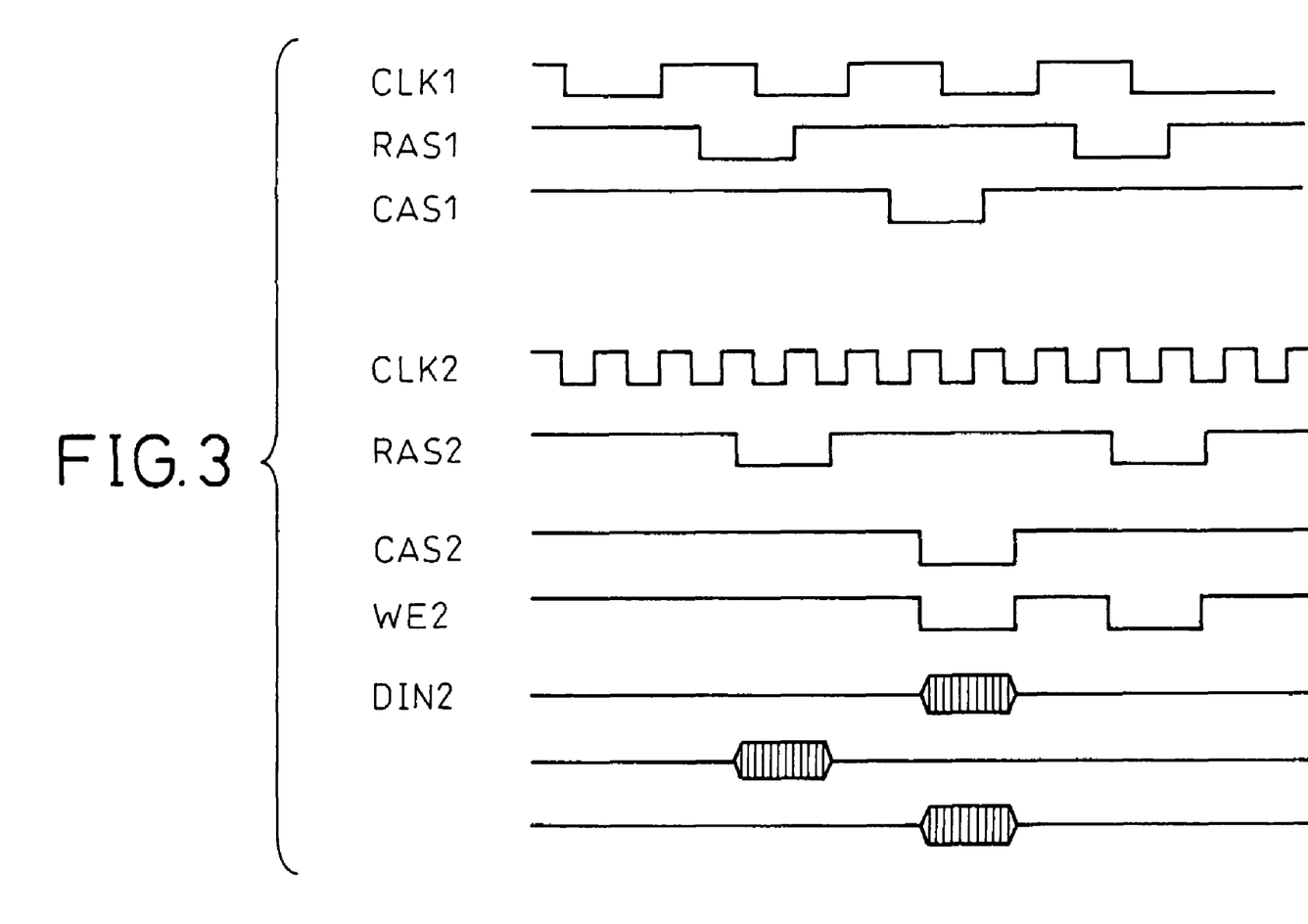
FIG. 3 is a diagram showing examples of input and output waveforms in a circuit block mounted on the adapter card.

FIG. 3 is a diagram showing the input and output waveforms in the circuit block 3: CLK1, RAS1, and CAS1 are signals output from the signal generator 11a, and CLK2, RAS2, CAS2, WE2, DIN2, AD(R)2, and AD(C)2 are signals output from the circuit block 3. In the figure, only CLK1, RAS, and CAS are shown as the outputs of the signal generator 11a, but signals WE1, DIN1, AD(R)1, and AD(C)1 are also input to the adapter card 10 in accordance with the timing shown in FIG. 3.

Figure 4:
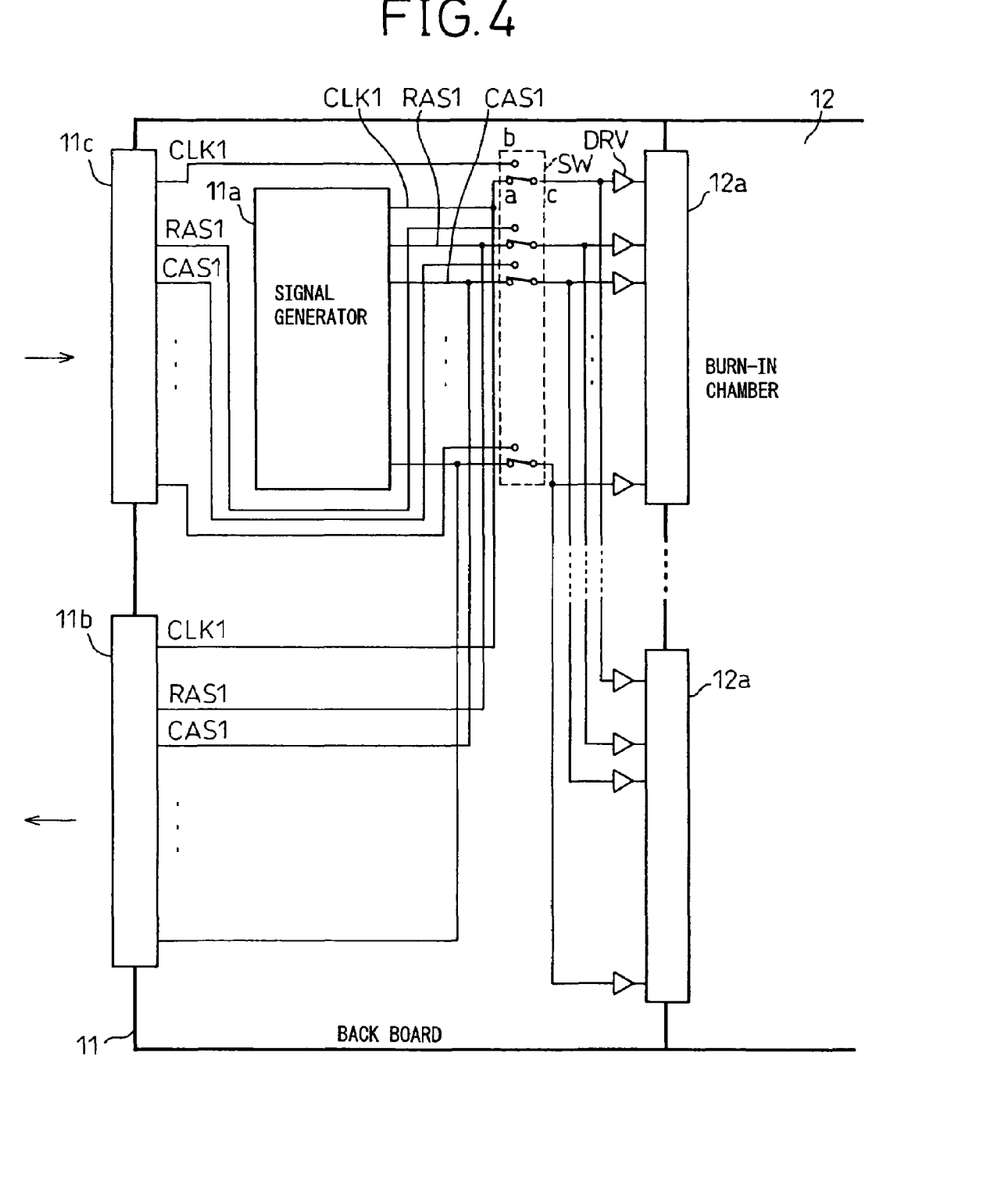
FIG. 4 is a diagram showing one configuration example of a back board according to the embodiment of the present invention.

FIG. 4 is a diagram showing one configuration example of the back board 11 according to the present embodiment.

In the figure, reference numeral 11a is the signal generator 11a mounted on the back board, and SW is a selector switch with a plurality of contacts which operate in an interlinked fashion.

The clock signal CLK1 and the burn-in signal of RAS1, CAS1, etc. output from the signal generator 11a are connected to the "a" contacts of the selector switch SW as well as to terminals on a connector 11b which is mounted, for example, on the rear side of the back board 11. The "b" contacts of the selector switch SW are connected to a connector 11c which is mounted, for example, on the rear side of the back board 11. Further, terminals "c" on the selector switch SW are connected via respective driver circuits DRV to the corresponding terminals provided on each of the plurality of burn-in card connecting connectors 12a mounted on the side of the back board 11 that faces the burn-in chamber 12.

Figure 5A:
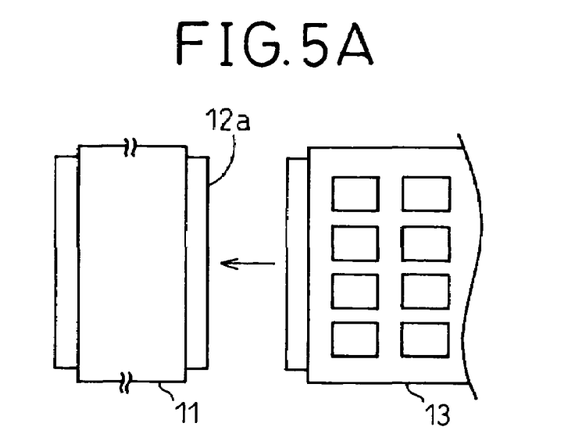
FIGS. 5A to 5C are diagrams for explaining how the adapter card is used according to the embodiment of the present invention.
Figure 5B:
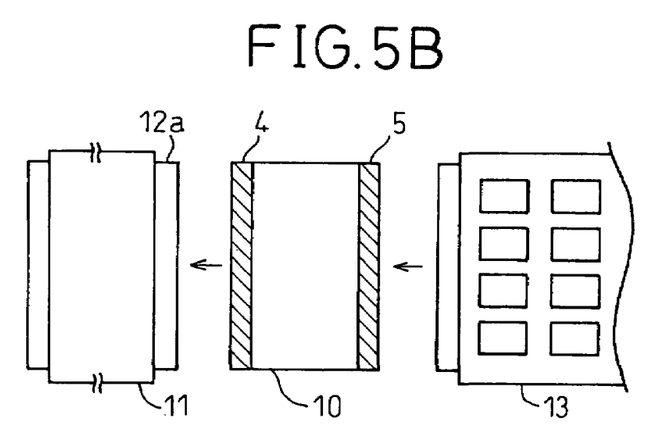
Figure 5C:
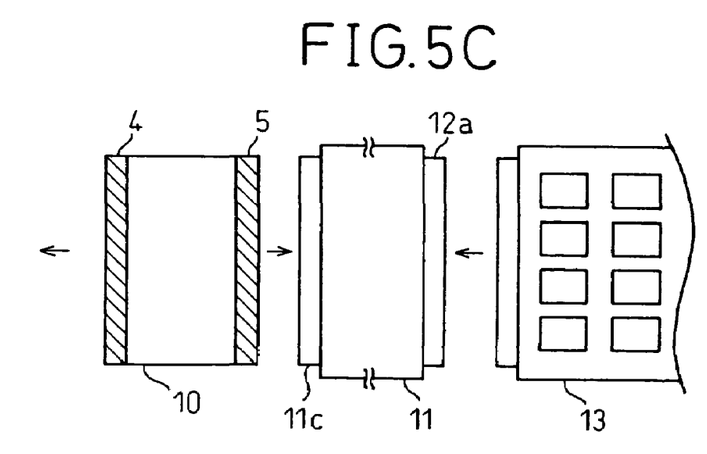

FIGS. 5A to 5C and FIGS. 6A and 6B are diagrams showing how the adapter card is used in the burn-in apparatus according to the present embodiment. FIG. 5A shows the case where the adapter card 10 is not used, FIG. 5B shows the case where the adapter card 10 is connected between the connector 12a of the back board 11 and the burn-in card 13, and FIG. 5C shows the case where the adapter card 10 is connected to the connector 11c mounted on the rear side of the back board 11.

Using the burn-in apparatus and the adapter card according to the present embodiment, semiconductor devices can be burned in as described below.

(1) When conventionally burning in semiconductor devices, i.e., without using the adapter card 10.

The selector switch SW in FIG. 4 is thrown to the "a" side, and the burn-in card 13 is directly connected to the connector 12a of the back board 11, as shown in FIG. 5A.

In this condition, the clock signal CLK1 and the burn-in signal of RAS1, CAS1, etc. output from the signal generator 11a are supplied via the driver circuits DRV and the connector 12a to the semiconductor device mounted on the burn-in card 13 to burn in the semiconductor device.

(2) When burning in relatively high-speed, high-functionality semiconductor devices by connecting the adapter card 10 between the back board 11 and the burn-in card 13.

The selector switch SW in FIG. 4 is thrown to the "a" side, and the connector 4 of the adapter card 10 shown in FIG. 1 is connected to the connector 12a of the back board 11, while the burn-in card 13 is connected to the connector 5 of the adapter card 10, as shown in FIG. 5B.

Then, the clock signal CLK1 and the burn-in signal of RAS1, etc. output from the signal generator 11a mounted on the back board 11 are supplied via the connector 12a and the connector 4 to the adapter card 10.

As shown in FIG. 3, the adapter card 10 outputs the clock signal CLK2, whose frequency is higher than (in the case of FIG. 1, three times) the frequency of the clock signal CLK1, and the burn-in signal of RAS2, CAS2, etc. synchronized to the clock signal CLK2. These signals are supplied via the connector 5 of the adapter card 10 to the burn-in card 13 on which the semiconductor device is mounted.

(3) When burning in relatively high-speed, high-functionality semiconductor devices by connecting the adapter card 10 to the connectors 11b and 11c mounted on the rear side of the back board 11.

The selector switch SW in FIG. 4 is thrown to the "b" side, and the connector 5 of the adapter card 10 is connected to the connector 11c mounted on the rear side of the back board 11, as shown in FIG. 5C. The burn-in card on which the semiconductor device is mounted is connected to the connector 12a mounted on the side of the back board 11 that faces the burn-in chamber 12.

Figure 6A:
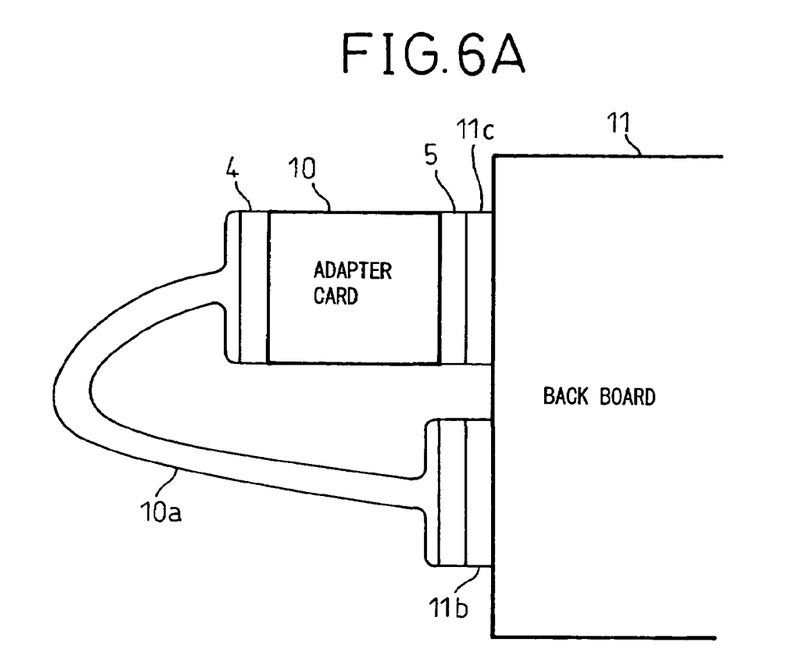
FIGS. 6A and 6B are diagrams for explaining how the adapter card is connected to a connector mounted on the rear side of the back board.

Further, as shown in FIG. 6A, the connector 4 of the adapter card 10 is connected via a connecting cord 10a to the connector 11b mounted on the rear side of the back board 11.

In this condition, the clock signal CLK1 and the burn-in signal of RAS1, etc. output from the signal generator 11a are supplied to the adapter card 10 via the connector 11b, the connecting cord 10a, and the connector 4 of the adapter card 10, and the adapter card 10 outputs the clock signal CLK2, whose frequency is higher than (in the case of FIG. 1, three times) the frequency of the clock signal CLK1, and the burn-in signal of RAS2, CAS2, etc. synchronized to the clock signal CLK2, as shown in FIG. 3.

The clock signal CLK2 and the burn-in signal, output from the adapter card 10, are supplied via the "b" contacts of the switch SW, the terminals "c", the driver circuits DRV, and the connector 12a of the back board 11 to the burn-in card 13 on which the semiconductor device is mounted.

(4) When burning in higher-speed, higher-functionality semiconductor devices by connecting the adapter card 10 plus an oscillator circuit card 14 to the connectors 11b and 11c mounted on the rear side of the back board 11.

The selector switch SW in FIG. 4 is thrown to the "b" side, and the connector 5 of the adapter card 10 is connected to the connector 11c mounted on the rear side of the back board 11, as shown in FIG. 5C. The burn-in card on which the semiconductor device is mounted is connected to the connector 12a mounted on the side of the back board 11 that faces the burn-in chamber 12.

Figure 6B:
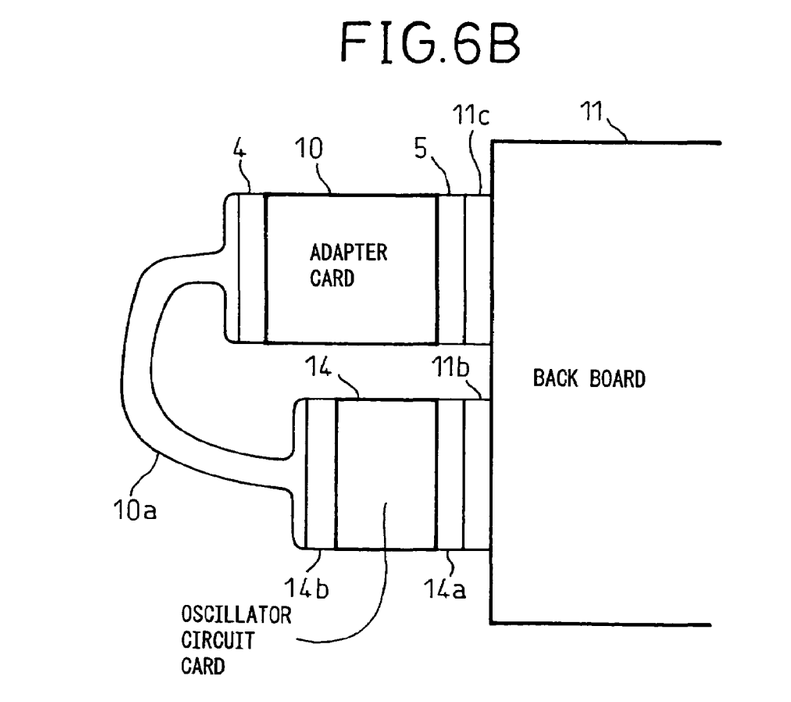

Further, as shown in FIG. 6B, a connector 14a on the input side of the oscillator circuit card 14 is connected to the connector 11b mounted on the rear side of the back board 11, and a connector 14b on the output side of the oscillator circuit card 14 is connected via a connecting cord 10a to the connector 4 of the adapter card 10.

Figure 7:
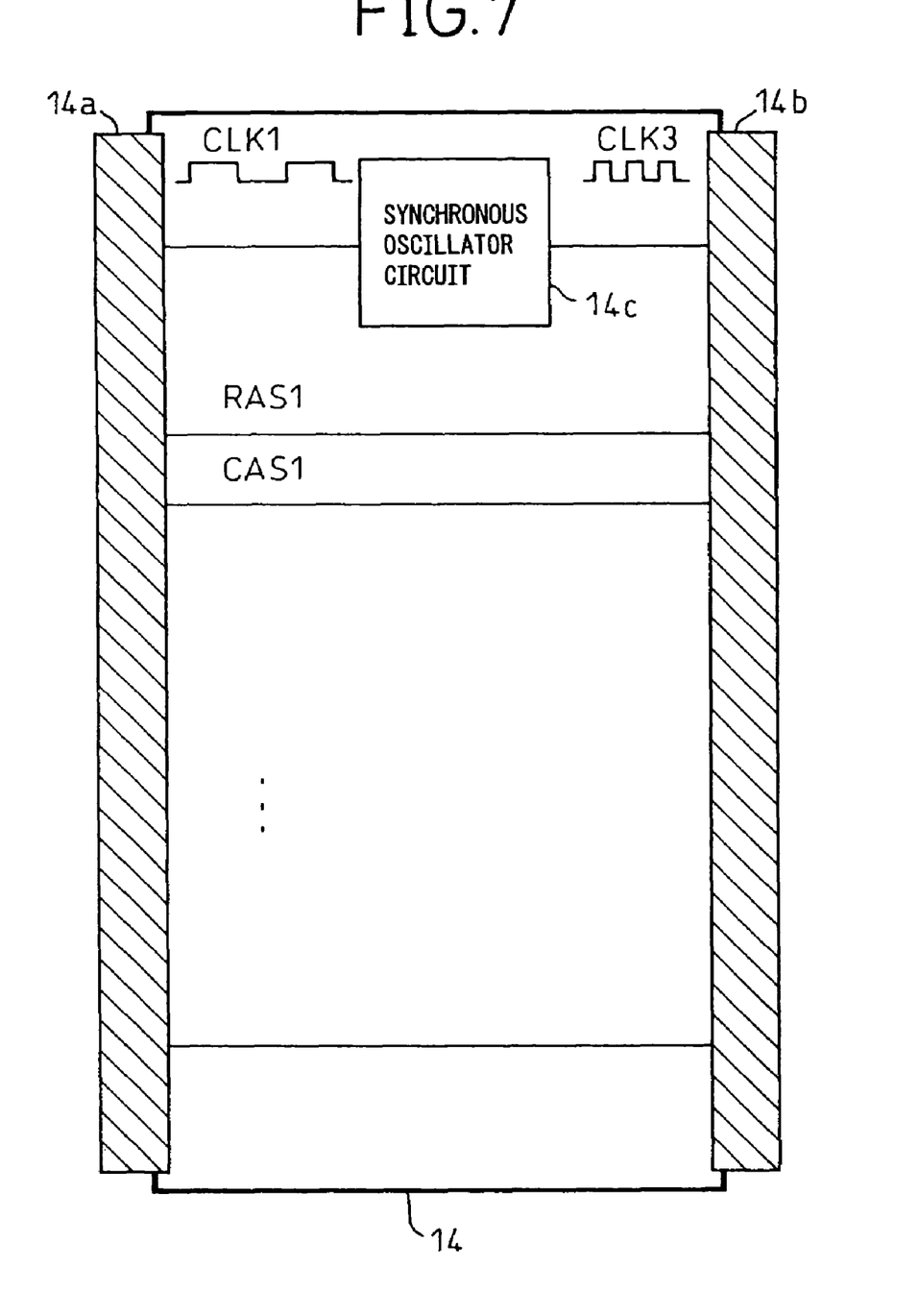
FIG. 7 is a diagram showing one configuration example of an oscillator circuit card.

The oscillator circuit card 14 contains a synchronous oscillator circuit 14c, for example, as shown in FIG. 7, and the synchronous oscillator circuit 14c, synchronized to the clock signal CLK1 output from the signal generator 11a and input via the input connector 14a, generates a clock signal CLK3 whose frequency is higher than the frequency of the clock signal CLK1.

This clock signal CLK3 is supplied to the adapter card 10 via the output connector 14b of the oscillator circuit card 14, the connecting cord 10a, and the connector 4.

On the other hand, the burn-in signal of RAS1, CAS1, etc. output from the signal generator 11a is input via the input connector 14a of the oscillator circuit card 14, and output from the output connector 14b of the oscillator circuit card 14 and input via the connecting cord 10a and the connector 4 into the adapter card 10.

In this way, the clock signal CLK3, whose frequency is higher than the frequency of the clock signal CLK1 output from the signal generator 11a, is input to the adapter card 10. When the clock signal CLK3 is input, the adapter card 10 outputs the clock signal CLK2, whose frequency is higher than (in the case of FIG. 1, three times) the frequency of the clock signal CLK3, and the burn-in signal of RAS2, CAS2, etc. synchronized to the clock signal CLK2, as previously described.

The clock signal CLK2 and the burn-in signal, output from the adapter card 10, are supplied via the "b" contacts of the switch SW, the terminals "c", the driver circuits DRV, and the connector 12a of the back board 11 to the burn-in card 13 on which the semiconductor device is mounted.

In the case (2) where the adapter card 10 is connected between the back board 11 and the burn-in card 13, a plurality of adapter cards 10 will become necessary, but the use of the adapter card 10 can be selected for each burn-in card. For example, for a burn-in card on which a relatively high-speed, high-functionally semiconductor device is mounted, burn-in test is performed by connecting the adapter card 10; on the other hand, for a burn-in card on which a relatively slow-speed semiconductor device is mounted, burn-in test can be performed without using the adapter card.

When the adapter card 10 is connected to the connectors 11b and 11c mounted on the rear side of the back board 11 as shown in the case (3), the relatively high-speed, high-functionality semiconductor devices mounted on the plurality of burn-in cards can be burned in simultaneously by using the single adapter card.

Further, when the adapter card 10 and the oscillator circuit card are connected to the connectors 11b and 11c mounted on the rear side of the back board 11 as shown in the case (4), higher-speed, higher-functionally semiconductor devices can be burned in, because the frequency of the clock frequency can be further increased. Besides, as in the case (3), the high-speed, high-functionality semiconductor devices mounted on the plurality of burn-in cards can be burned in simultaneously by using the single adapter card.

In the case (4), a delay circuit or the like for delaying the burn-in signal, as shown in FIG. 1, may be mounted on the oscillator circuit card 14 to synchronize the burn-in signal of RAS1, CAS1, etc. to the clock signal CLK3.

As described above, the following advantageous effects can be obtained according to the present invention.

Using the adapter card having a relatively simple circuit configuration, the burn-in of high-speed, high-functionality semiconductor devices can be accomplished in a short time.

Further, in addition to the connectors to which the burn-in cards are connected, a first connector as an input-side connector and a second connector as an output-side connector are provided on the burn-in apparatus and, with the first connector connected to the output connector of the adapter card and the second connector to the input connector of the adapter card, the converted signal is output from the burn-in card connecting connectors to burn-in the semiconductor devices mounted on the burn-in cards; in this configuration, using the single adapter card, the high-frequency clock signal can be supplied to the semiconductor devices mounted on the plurality of burn-in cards, and burn-in can be accomplished in a short time even when they are high-speed, high-functionality semiconductor devices.

Furthermore, when the oscillator circuit card having an oscillator circuit is connected between the second connector and the input connector of the adapter card, the high-frequency clock signal, that the oscillator circuit mounted on the oscillator circuit card outputs, can be supplied to the semiconductor devices mounted on the plurality of burn-in cards; in this configuration, the burn-in of higher-speed, higher-functionality semiconductor devices can be accomplished in a short time.

What is claimed is:

1. An adapter card connecting a signal generator of a dynamic burn-in apparatus to a burn-in card with semiconductors, comprising:
   an input connector receiving a burn-in signal in synchronization with an input clock signal from said signal generator;
   a clock signal converting circuit which converts the input clock signal from said input connector to a converted clock signal; and
   an output connector providing the burn-in signal in synchronization with said converted clock signal to said semiconductors.

2. An adapter card as claimed in claim 1, further comprising a delay circuit providing said burn-in signal in synchronization with said converted clock signal.

3. An adapter card as claimed in claim 1, wherein said clock signal converting circuit is a multiplier circuit which generates a converted clock signal whose frequency is n (n=1, 2, . . . ) times the frequency of the input clock signal.

4. An adapter card as claimed in claim 1, wherein said input connector is connected to a burn-in card connecting connector mounted on said burn-in apparatus, and said output connector is connected to said burn-in card.

5. A dynamic burn-in apparatus for semiconductor devices mounted on a burn-in card, comprising:
   a signal generator and an adapter card, said adapter card comprising:
   an input connector receiving a burn-in signal in synchronization with an input clock signal from said signal generator;
   a clock signal converting circuit which converts the input clock signal from said input connector to a converted clock signal; and
   an output connector providing the burn-in signal in synchronization with said converted clock signal to the semiconductor devices.

6. A dynamic burn-in apparatus as claimed in claim 5, further comprising a board carrying said signal generator, said board having a pair of connectors and at least one burn-in card connecting connector, wherein said signal generator connects to the semiconductor devices mounted on said burn-in card via said adapter card connected between the pair of connectors.

7. A dynamic burn-in apparatus as claimed in claim 6, further comprising an oscillator circuit card having an oscillator circuit for providing a higher frequency clock signal in synchronization with the input clock signal from the signal generator, wherein said adapter card connects to said pair of adapter card connectors via said oscillator circuit card.

* * * * *